United States Patent [19]

Walker et al.

[11] 4,320,312
[45] Mar. 16, 1982

[54] SMALLER MEMORY CELLS AND LOGIC CIRCUITS

[75] Inventors: Laurence G. Walker, Palo Alto; James D. Sansbury, Portola Valley; Robert D. Rung Jr., Menlo Park; Juliana Manoliu, Palo Alto, all of Calif.

[73] Assignee: Hewlett-Packard Company, Palo Alto, Calif.

[21] Appl. No.: 947,377

[22] Filed: Oct. 2, 1978

[51] Int. Cl.³ .................... H03K 5/00; H03K 17/60; H01L 29/78
[52] U.S. Cl. .................. 307/238.8; 307/585; 305/279; 307/300; 307/300; 307/304; 357/23; 357/91
[58] Field of Search ............... 307/300, 304, 251, 279, 307/238; 359/23, 91

[56] References Cited

U.S. PATENT DOCUMENTS

| | | | |
|---|---|---|---|
| 3,416,008 | 12/1968 | Memelink | 307/238 |
| 4,040,082 | 8/1977 | Goser | 307/304 |
| 4,059,826 | 11/1977 | Rogers | 357/91 |
| 4,069,068 | 1/1978 | Beyer et al. | 357/91 |
| 4,092,735 | 5/1978 | McElroy | 357/91 |
| 4,118,640 | 10/1978 | Ochi et al. | 307/304 |
| 4,163,243 | 7/1979 | Kamins et al. | 357/91 |
| 4,197,144 | 4/1980 | Kirkpatrick | 357/91 |

*Primary Examiner*—Andrew J. James
*Attorney, Agent, or Firm*—John A. Frazzini

[57] ABSTRACT

A method and device are disclosed for reducing the circuit size of a class of circuits including many memory cells and logic circuits. Selected drain to bulk or source to bulk transistor junctions are made leaky. The leaky junctions perform their intended (non-leaky) functions as well as the functions of certain other circuit elements. These other elements may therefore be eliminated from the circuit.

6 Claims, 9 Drawing Figures

BIT LINE          $\overline{\text{BIT LINE}}$

SMALLER MEMORY CELLS AND LOGIC CIRCUITS

BACKGROUND OF THE INVENTION

This invention relates to integrated circuits (ICs) generally, and to static CMOS (Complementary Metal Oxide Semiconductor) memory cells and logic circuits in particular. The number of circuits that are producible on a substrate of a given size is dependent on the number and size of the elements in each circuit. To reduce the size of such a circuit, many prior art methods redesign the circuit to reduce the number of elements or replace some of the larger circuit elements with smaller ones. For example, one method reduces an eight-transistor memory cell to the six-transistor cell shown in FIG. 1A (see, for example, "Digital Circuits and Logic Design" by S. C. Lee, Prentice-Hall, Englewood Cliffs, N.J., 1976, pages 569–571).

In the memory cell of FIG. 1A, the six transistors act as gates to control the voltages on a pair of nodes 10 and 11. A control transistor 12 controls access from a bit line to node 10, while another control transistor 13 controls access from a $\overline{\text{bit}}$ line to node 11. The memory state of this cell is represented by the voltage on node 10—a "1" is represented by a voltage within a range near a voltage $V_1$ and a "0" by a voltage within a range near a voltage $V_2$. Because current leakage across transistor 12 is generally unavoidable, a set of logic transistors 14, 15, 16 and 17 is provided to control access to nodes 10 and 11 from a voltage source 18 of voltage $V_1$ and a voltage source 19 of voltage $V_2$. This arrangement maintains the voltage stored on node 10 at its appropriate value. In order to act as a gate controlling access to node 10, each of the transistors 12, 14 and 16 must function to make any preselected path to node 10 have much higher conductance than the other paths. This requires that the on state conductance $g_{on}$ of each transistor connected to node 10 must be much greater than the off state conductance $g_{off}$ of the other transistors connected to node 10. Comparable constraints apply to the transistors connected to node 11. In operation, the voltage on node 10 is held within a range near $V_1$ or $V_2$ depending on whether the conductance of transistor 14 is respectively much greater or much less than the conductance of transistor 16. Transistor 16 can therefore be replaced with a resistor of conductance $g_r$ in the range:

$$g_{off} < < g_r < < g_{on}$$

without changing the operation of this memory cell. Likewise, transistor 15 or 17 can be replaced with a resistor. (See the article entitled "Resistance-CMOS Circuits" by H. Oguey and E. Vittoz in *IEEE Journal of Solid State Circuits*, Vol. SC-12, No. 3, June, 1977, page 283.) This procedure provides some design flexibility, but does not reduce the overall number of elements in the circuit.

SUMMARY OF THE INVENTION

The present invention discloses a method and a device for reducing the circuit size of a class of circuits by requiring selected transistor junctions to be leaky to thereby perform the functions of other elements which can therefore be eliminated from the circuits. A circuit in the class is characterized as having a node to which are electrically connected: (1) a first voltage source through a first electrical path, (2) a second voltage source through a second electrical path and (3) a control transistor which is responsive to applied control signals. The first electrical path contains a logic transistor which is responsive to logic signals and which cooperates with the other circuit elements to control the voltage on the node to represent a digital logic state.

In general, the leakage current across the control transistor junction between its bulk and its source or drain electrode (the source and drain being collectively referred to as doped regions) which is electrically connected to the node will be utilized. Such an electrode will be referred to herein as the selected electrode, the junction will be called the selected junction and the conductance of the selected junction under reverse bias will be called the leakage conductance. In general the current to and from the node is due not only to the conductance of the transistors connected to the node, but also to the conductance of their parasitic elements. According to the method, a "leaky" control transistor is employed having a leakage conductance in the range between the off state conductance and on state conductance of the combination of logic transistors and all parasitic elements connected to the node. This leakage path performs its intended functions as well as those of the second electrical path. Some or all of the circuit elements on the second electrical path are then eliminated, thereby making possible a circuit of identical function, but of smaller physical size.

DESCRIPTION OF THE PREFERRED EMBODIMENT

The present invention is a method for reducing the circuit size of a class of integrated circuits by selecting certain transistor junctions to be leaky, thereby performing the function of other circuit elements which can then be eliminated. The nature of the junctions and leakage currents can be seen by referring to the channel MOSFET shown in FIG. 2.

Figure 1A:
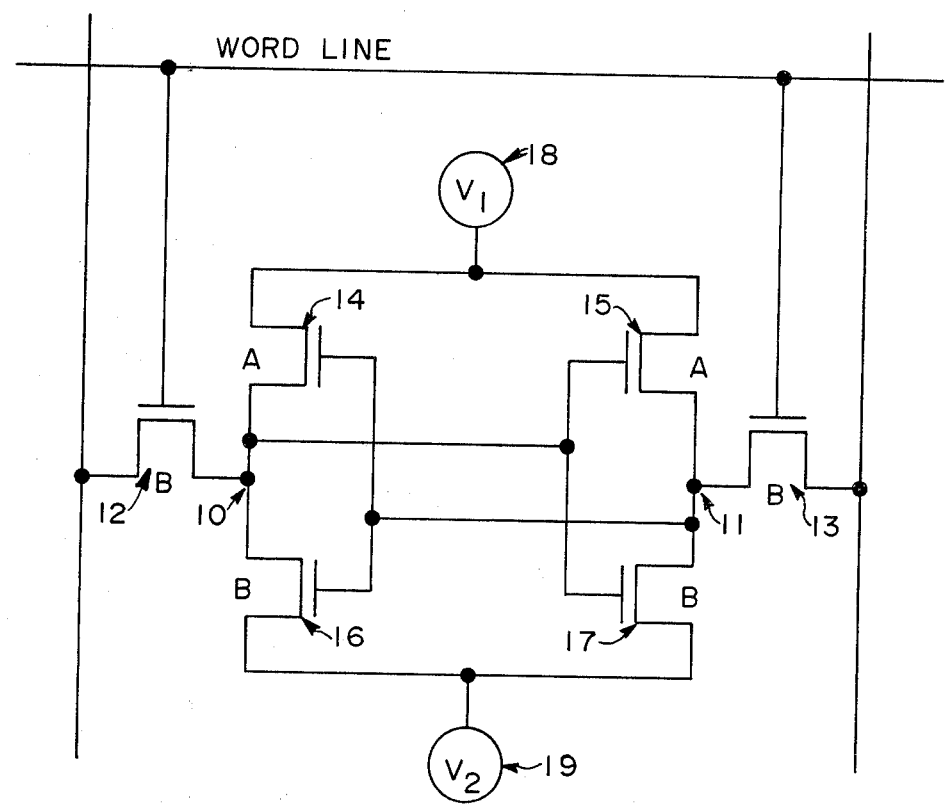
FIG. 1A shows a prior art memory cell to which the disclosed method is applicable.
Figure 2:
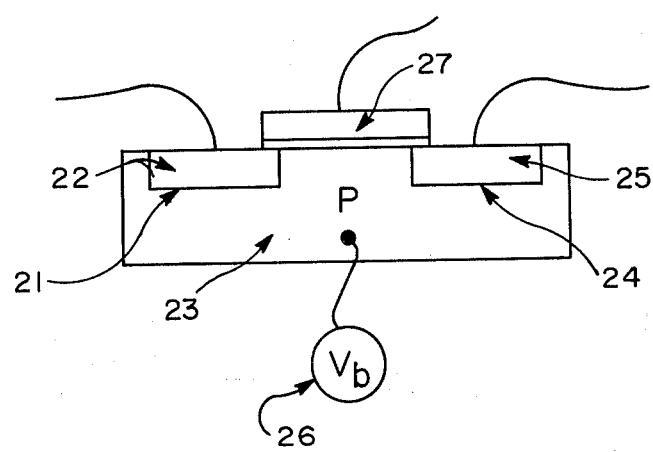
FIG. 2 shows the parts of a MOSFET to clarify the role of the drain junction in the method.

FIG. 2 shows a transistor having a source junction 21 between a source 22 and a bulk region 23 and also a drain junction 24 between a drain 25 and bulk 23 (the source and drain being collectively referred to as doped regions). A voltage $V_b$ is applied to the bulk region by voltage source 26 to prevent these junctions from becoming forward biased under operating conditions. A gate electrode 27 controls current flow between source 22 and drain 25. In practice the source and drain junctions function as reverse biased diode junctions. Under reverse bias, a leakage current flows across the drain junction indicating a typical leakage conductance of about $10^{-13}$ mho for a 6 volt reverse bias. This leakage current has caused problems in prior circuits so that prior art methods typically seek to reduce or compensate for such leakage currents. For example, it was noted in the Background that in the prior art memory cell of FIG. 1A there is generally an unavoidable leakage current from node 10 to other nodes. A set of logic transistors 14, 15, 16 and 17 are therefore required to access nodes 10 and 11 from a first voltage source 18 of voltage $V_1$ and a second voltage source 19 of voltage $V_2$ to maintain the proper value of the voltage on node 10. A transistor will herein be referred to as being of "A" or "B" conduction type depending on whether, under operating conditions, a forward bias across its source and drain junctions can be prevented by biasing the bulk at voltage $V_1$ or $V_2$ respectively.

Figure 3A:
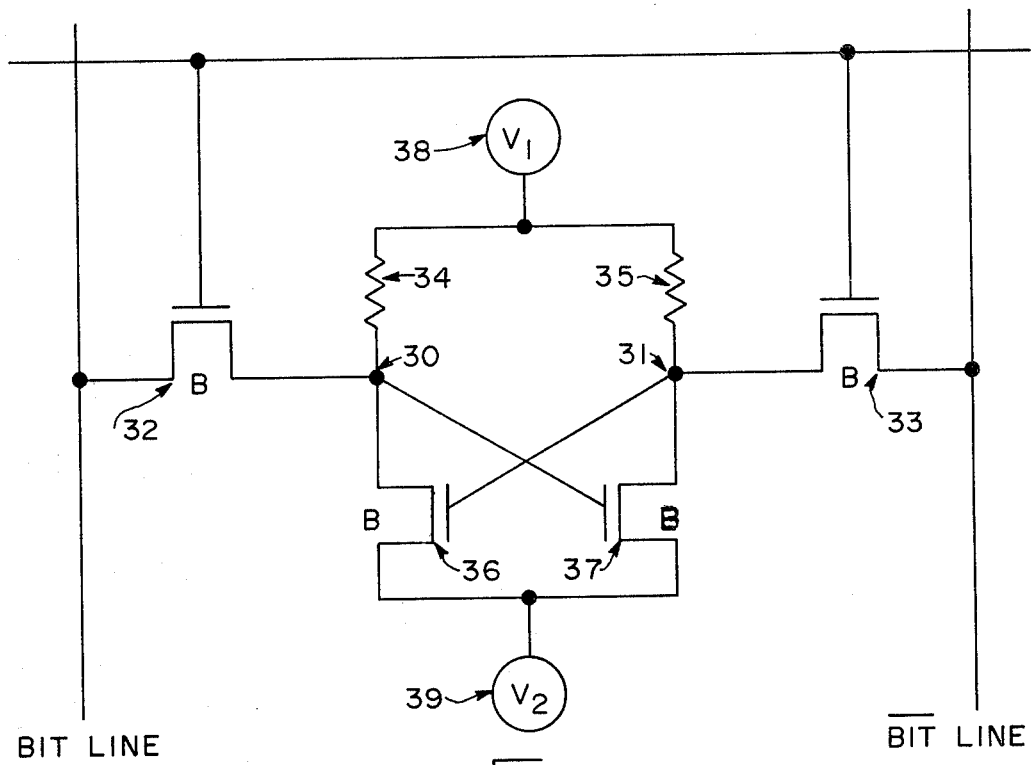
FIG. 3A shows a prior art circuit derivable from the circuit in FIG. 1A by replacing two transistors with two resistors.

As shown in the Background, transistor 16 can be replaced by a resistor which has a conductance $g_r$ which is much greater than the off state conductance $g_{off}$ of transistors 12 and 14, and much less than their on state conductance $g_{on}$. Typical values for $g_{off}$ and $g_{on}$ are $10^{-13}$ mho and $10^{-4}$ mho, respectively, so that there is a wide range of suitable values for $g_r$. The circuit which results by replacing transistors 14 and 15 with resistors 34 and 35 is shown in FIG. 3A. (In general, the first digit in the designation of a circuit element will represent the number of the figure showing that circuit. Corresponding elements in other figures will be designated with corresponding last digits.) Such a circuit still employs the same number of elements as the circuit in FIG. 1A.

Circuits such as those shown in FIG. 1A can be replaced by circuits of greater simplicity than that shown in FIG. 3A. The voltage of the bulk bias of transistor 12 can be chosen to be $V_2$. For such a choice of bias, the leakage path across the drain junction of transistor 12 represents an existing electrical path from "$V_2$" or "the second voltage source" to node 10. Transistor 16 can therefore be eliminated if the conductance $g_{10}$ of this leakage path is chosen to lie in the range:

$$10^{-13} \text{ mho} \sim g_{off} << g_{10} << g_{on} \sim 10^{-4} \text{ mho}.$$

Transistor 17 can similarly be eliminated after an equivalent selection of the leakage conductance of the selected junction of transistor 13.

Figure 1B:
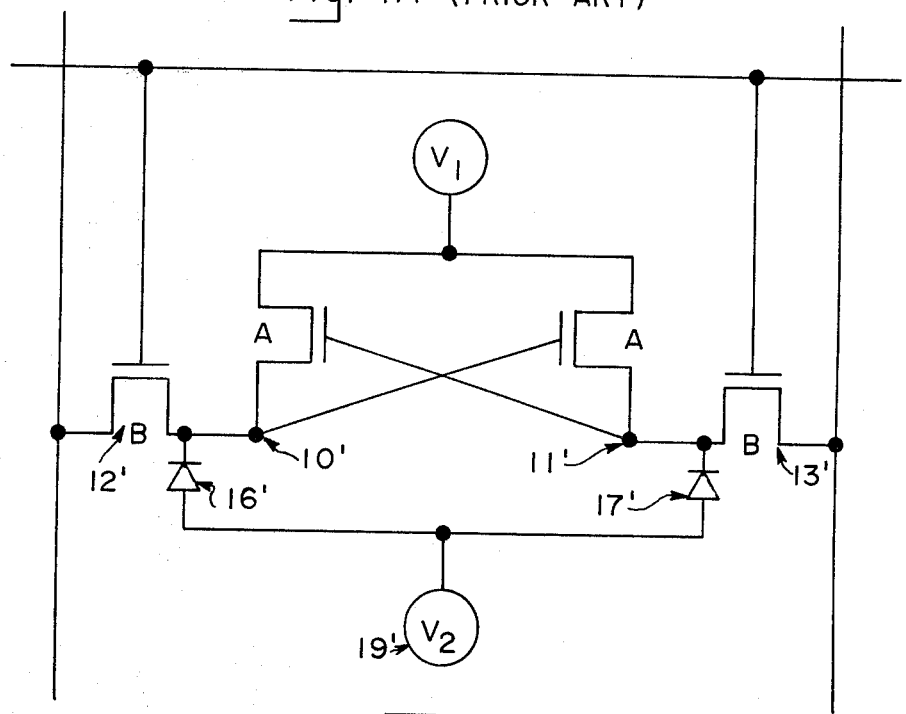
FIG. 1B shows a circuit derived from the circuit in FIG. 1A by the present method.
Figure 3B:
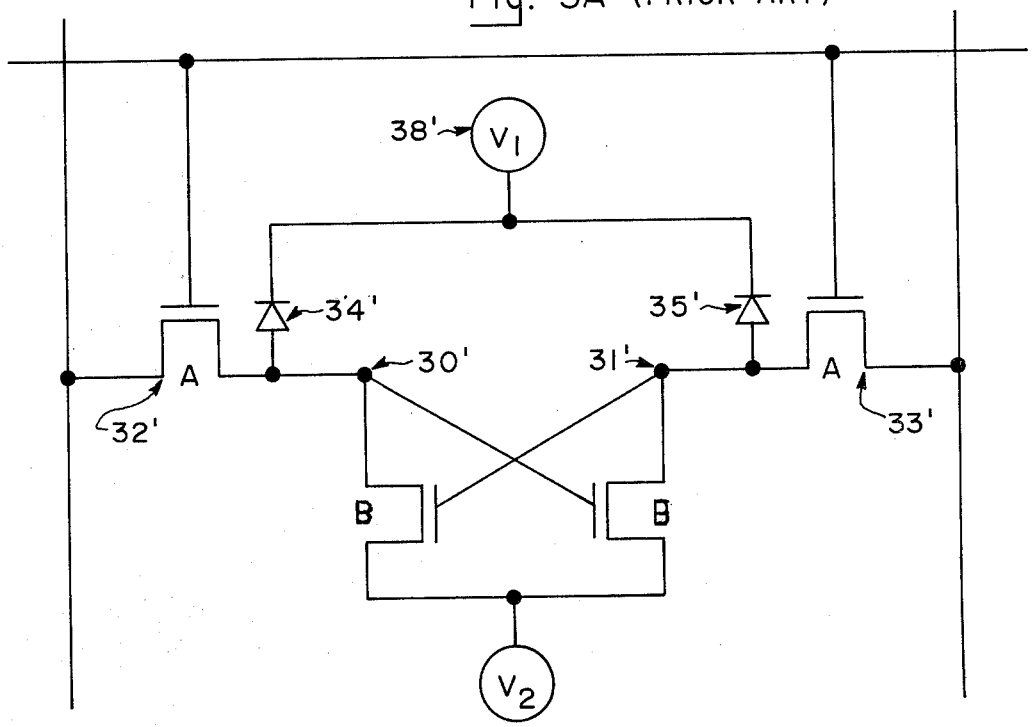
FIG. 3B shows a circuit derived from the circuit in FIG. 3A by the present method.

In a similar but more complicated manner transistor 14 can be eliminated in lieu of transistor 16. First, a leakage path from node 10 to voltage source 18 is created by replacing transistor 12 with a transistor of opposite conduction type having a leaky selected junction and having its bulk biased at $V_1$. The leakage conductance of its drain junction now provides a resistive path from voltage source 18 to node 10 thereby allowing transistor 14 to be eliminated. FIGS. 1B and 3B show circuits which result by this method from circuits 1A and 3A respectively. Diodes 16' and 17' of FIG. 1B represent the selected junctions of transistors 12' and 13' respectively which provide electrical paths from voltage source 19' to nodes 10' and 11'. Likewise, in FIG. 3B, diodes 34' and 35' represent the selected junctions of transistors 32' and 33' respectively, which provide electrical paths from voltage source 38' to nodes 30' and 31'.

Figure 4A:
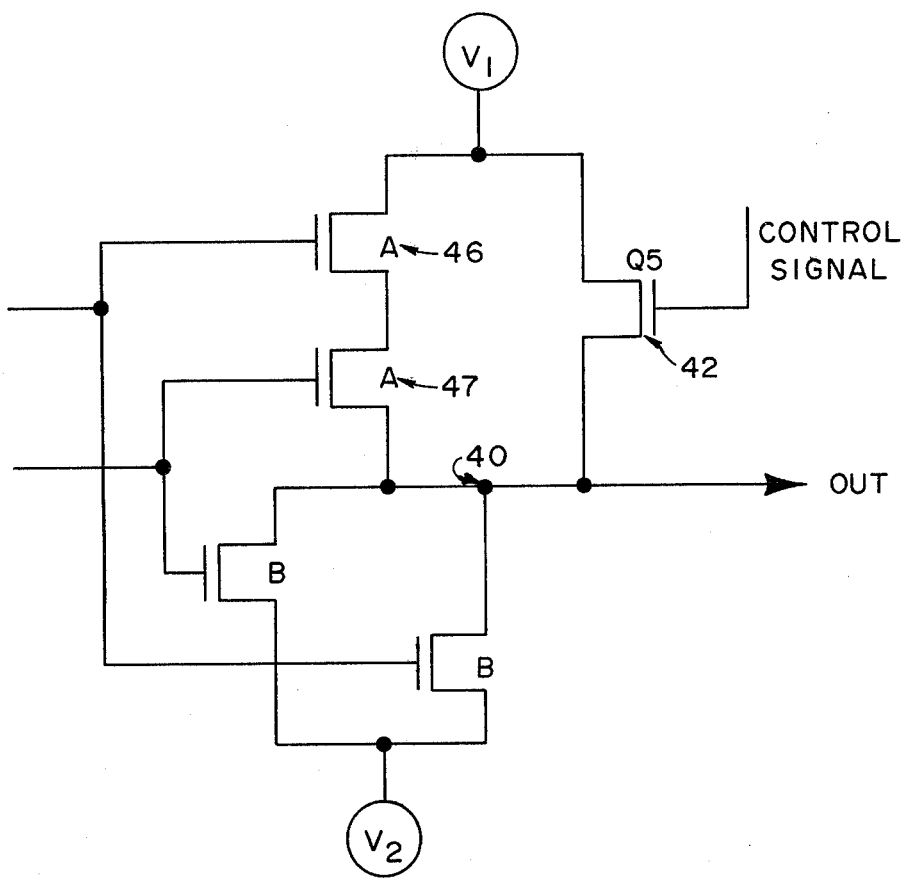
FIG. 4A shows a circuit in which a pair of series transistors can be eliminated in accordance with the present method.
Figure 4B:
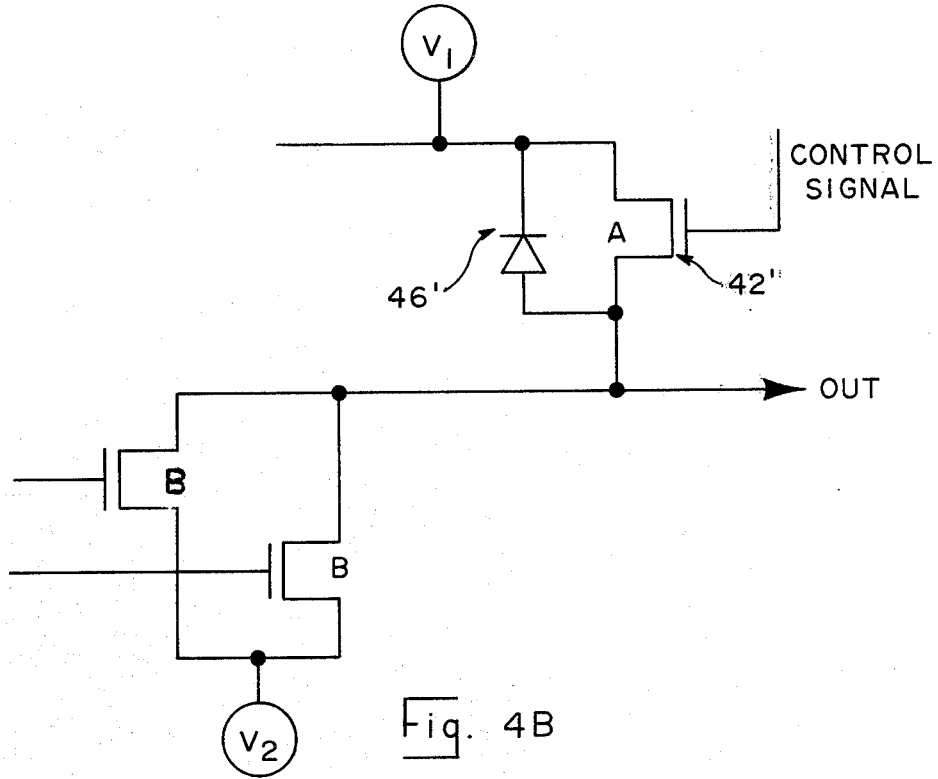
FIG. 4B shows a circuit derived from the circuit in FIG. 4A by the present method.
Figure 5A:
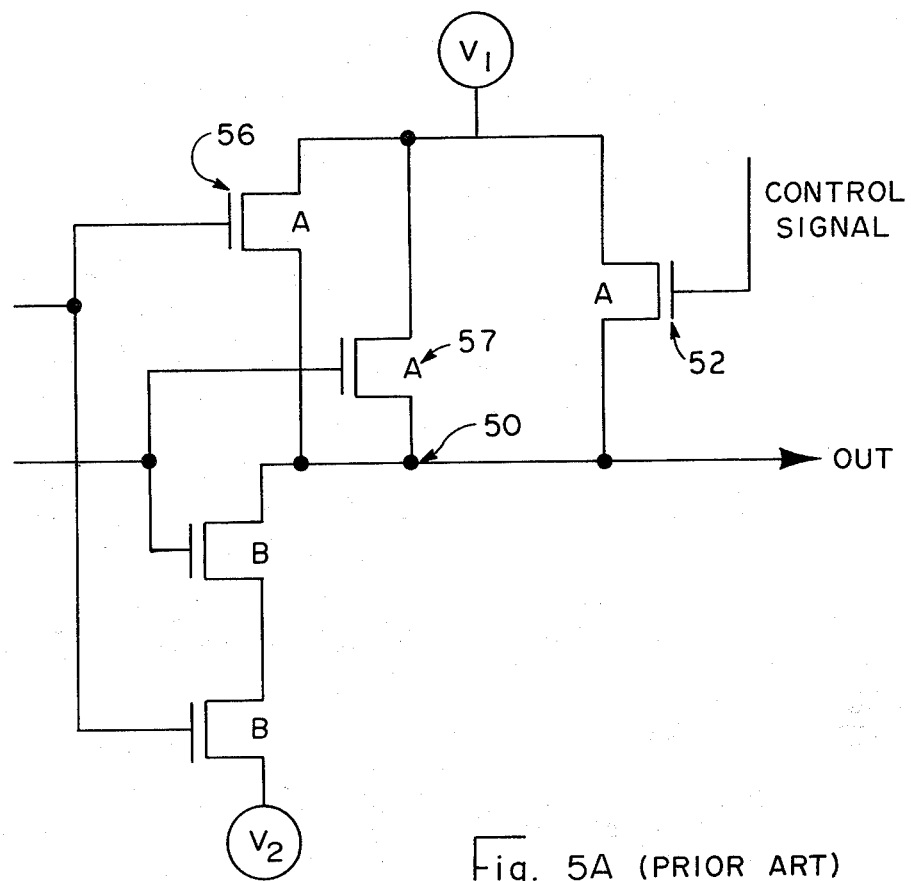
FIG. 5A shows a circuit in which a pair of parallel transistors can be eliminated in accordance with the present method.
Figure 5B:
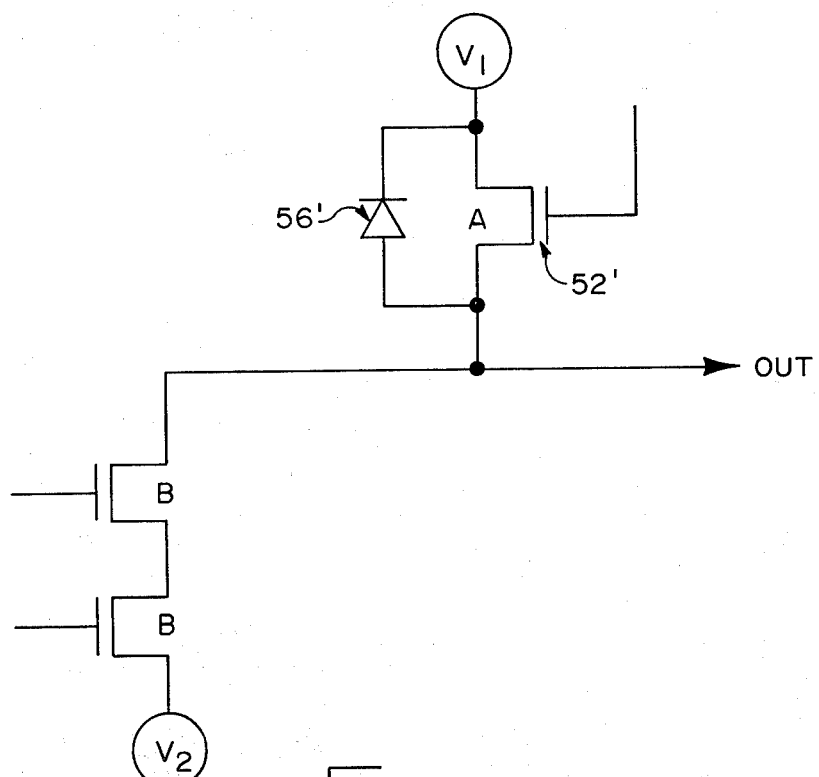
FIG. 5B shows a circuit derived from the circuit in FIG. 5A by the present method.

There are also circuits in which several elements can be eliminated by exploiting a single leaky control transistor junction. For example, FIG. 4A shows a circuit in which two series elements can be eliminated and FIG. 5A shows a circuit in which two parallel elements can be eliminated. In FIG. 4A, after replacing a transistor 42 with a transistor 42' having a leaky drain junction, a pair of transistors 46 and 47 can be eliminated to give the circuit in FIG. 4B. Diode 46' represents the drain junction of transistor 42'. In FIG. 5A, after employing a transistor 52' having a leaky selected junction, a pair of transistors 56 and 57 can be eliminated to give the circuit in FIG. 5B. Diode 56' represents the drain junction of transistor 52'. In the same manner that existing circuits can be reduced by exploiting leakage currents, new smaller circuits can be designed by exploiting leaky transistor junctions.

A preferred method for producing the "leaky junctions" of the invention is by ion implanting "good" junctions. Typically, the ions used for implantation are selected to disrupt the crystal lattice. Neon has been found to be a useful choice. The lattice defects create states of energy in the gap between the valence and conduction energy bands so that electron-hole pairs can be more easily formed. Since leakage current across a transistor junction is due in part to electron-hole pairs formed in the junction region, the energy of the bombarding ions is generally selected such that some implant damage is introduced in the bulk to electrode space charge region. This damage makes the junction leaky without notably changing the junction's other properties so that the implanted transistor junctions continue to perform their prior functions as well as the functions of the eliminated elements.

The leakage conductance can be accurately controlled by controlling the area and periphery of junction exposed to damage, the number and kind of ions implanted and the ion acceleration potential. For example, a dose of $3 \times 10^{14}$ Neon ions per cm$^2$ at 150 mev impact energy, produces a conductance of about $10^{-8}$ mho in a 900 $\mu$m by 900 $\mu$m p+ junction. To minimize power drain through the leaky junction, the conductance of the leakage path should be chosen as close to $g_c$ as allows the circuit to continue functioning properly. Such a conductance is easy to achieve by enhancement from an initial value of $g_c$.

We claim:

1. A logic circuit comprising:
    a first voltage source of voltage $V_1$;
    a second voltage source of voltage $V_2$;
    a leaky MOSFET having a bulk region connected to the second voltage source to bias the bulk region at $V_2$ and having a doped region forming a leaky p-n junction of conductance $\bar{g}$ with the bulk region, said MOSFET being of the conduction type for which a bulk bias $V_2$ preserves a reverse bias on said junction for doped region voltages in the range between $V_1$ and $V_2$; and
    a variable conductance device having a first electrode connected to the first voltage source, a second electrode connected to the doped region of the MOSFET and a logic input responsive to logic signals to control the conductance between its first and second electrodes to assume either a high conductance value greater than g or a low conductance value less than g, whereby said leaky junction and said variable conductance device are connected in series between the first and second voltage sources and whereby the voltage of the doped region assumes a first logic voltage level representing a first logic state when the variable conductance device assumes its high conductance value and whereby the voltage of the doped region assumes a second logic voltage level representing a second logic state when the variable conductance device assumes its low conductance value.

2. A logic circuit comprising:

a first voltage source of voltage $V_1$;

a second voltage source of voltage $V_2$;

a first leaky MOSFET having a first bulk region connected to the second voltage source to bias the first bulk region at $V_2$ and having a first doped region forming a first leaky p-n junction of conductance g with the first bulk region, said first MOSFET being of the conduction type for which a bulk bias $V_2$ preserves a reverse bias on said first junction for voltages of the first doped region in the range between $V_1$ and $V_2$;

a second leaky MOSFET having a second bulk region connected to the second voltage source to bias the second bulk region at $V_2$ and having a second doped region forming a second leaky p-n junction of conductance g with the second bulk region, said second MOSFET being of the conduction type for which a bulk bias $V_2$ preserves a reverse bias on said second junction for voltages of the second region in the range between $V_1$ and $V_2$;

a first variable conductance device having a first electrode connected to the first voltage source, a second electrode connected to the first doped region and a logic input connected to the second doped region and responsive to the voltage of the second doped region to control the conductance between its first and second electrodes to assume either a high conductance value greater than g or a low conductance value less than g, whereby said first leaky junction and said first variable conductance device are connected in series between the first and second voltage sources and whereby the voltage of the first doped region assumes a first logic voltage level representing a first logic state when the first variable conductance device assumes its high conductance value and whereby the voltage of the first doped region assumes a second logic voltage level representing a second logic state when the first variable conductance device assumes its low conductance value;

a second variable conductance device having a first electrode connected to the first voltage source, a second electrode connected to the second doped region and a logic input connected to the first doped region responsive to the voltage of the first doped region to control the conductance between its first and second electrodes to assume either a high conductance value greater than $\bar{g}$ or a low conductance value less than $\bar{g}$, whereby said second leaky junction and said second variable conductance device are connected in series between the first and second voltage sources; and said variable conductance devices interacting via the voltages produced on the doped regions to produce a pair of stable logic states in the first of which the voltage of the first doped region assumes the first logic level and in the second of which the voltage of the first doped region assumes the second logic level.

3. A logic circuit comprising:

a first voltage source of voltage $V_1$;

a second voltage source of voltage $V_2$;

a first leaky MOSFET having a first bulk region connected to the second voltage source to bias the first bulk region at $V_2$ and having a first doped region forming a first leaky p-n junction of conductance g with the first bulk region, said first MOSFET being of the conduction type for which a bulk bias $V_2$ preserves a reverse bias on said first junction for voltages of the first doped region in the range between $V_1$ and $V_2$;

a second leaky MOSFET having a second bulk region connected to the first voltage source to bias the second bulk region at $V_1$ and having a second doped region forming a second leaky p-n junction of conductance $\bar{g}$ with the second bulk region, said second MOSFET being of the conduction type for which a bulk bias $V_1$ preserves a reverse bias on said second junction for voltages of the second region in the range between $V_1$ and $V_2$;

a first variable conductance device having a first electrode mounted to the first voltage source, a second electrode connected to the first doped region and a logic input connected to the second doped region and responsive to the voltage of the second doped region to control the conductance between its first and second electrodes to assume either a high conductance value greater than g or a low conductance value less than g, whereby said first leaky junction and said first variable conductance device are connected in series between the first and second voltage sources and whereby the voltage of the first doped region assumes a first logic voltage level representing a first logic state when the first variable conductance device assumes its high conductance value and whereby the voltage of the first doped region assumes a second logic voltage level representing a second logic state when the first variable conductance device assumes its low conductance value;

a second variable conductance device having a first electrode connected to the second voltage source, a second electrode connected to the second doped region and a logic input connected to the first doped region responsive to the voltage of the first doped region to control the conductance between its first and second electrodes to assume either a high conductance value greater than $\bar{g}$ or a low conductance value less than $\bar{g}$, whereby said second leaky junction and said second variable conductance device are connected in series between the first and second voltage sources; and said variable conductance devices interacting via the voltages produced on the doped regions to produce a pair of stable logic states in the first of which the voltage of the first doped region assumes the first logic level and in the second of which the voltage of the first doped region assumes the second logic level.

4. A logic circuit as recited in claim 1 wherein the variable conductance device comprises a plurality of variable conductance elements connected in parallel between the first voltage source and the first node, each element being responsive to said logic signals to assume either a high or a low conductance state, the total conductance between the first voltage source and the first node being greater than g if at least one of the elements is in a high conductance state and being less than g if all of said elements are in a low conductance state.

5. A logic circuit as recited in claim 1 wherein the variable conductance device comprises a plurality of variable conductance elements connected in series between the first voltage source and the first node, each element being responsive to said logic signals to assume either a high or a low conductance state, the total conductance between the first voltage source and the first node being less than g if at least one of the elements is in a low conductance state and being greater than g if all of said elements are in a high conductance state.

6. An improved memory cell of the type wherein a variable conductance first conductive device and a second conductance device are connected in series between a pair of voltage sources, wherein a variable conductance third conductance device and a fourth conductance device are connected in series between the pair of voltage sources and are connected in parallel with the first and second conductance devices, wherein said first and third conductance devices each have a logic input to which a voltage is applied to control its conductance, wherein the logic input of the third conductance device is connected to a first node between the first and second conductance devices, wherein the logic input of the first conductance device is connected to a second node between the third and fourth conductance devices, and wherein the first and third conductance devices interact via the voltages on the first and second nodes to produce a pair of stable states in each of which the voltage on the first node represents the state of the cell, the improvement comprising:
  utilizing a reverse biased leaky junction between a bulk region and a doped region of a MOSFET as the second conductance device; and
  utilizing a reverse biased leaky junction between a bulk region and a doped region of a MOSFET as the fourth conductance device.

* * * * *

UNITED STATES PATENT AND TRADEMARK OFFICE
CERTIFICATE OF CORRECTION

PATENT NO. : 4,320,312
DATED : March 16, 1982
INVENTOR(S) : Laurence G. Walker et al It is certified that error appears in the above—identified patent and that said Letters Patent is hereby corrected as shown below:

Column 5, line 27, "g" should read -- $\bar{g}$ --.

Signed and Sealed this

First Day of June 1982

[SEAL]

Attest:

GERALD J. MOSSINGHOFF

Attesting Officer     Commissioner of Patents and Trademarks